United States Patent [19]

Sharp

[11] Patent Number: 4,477,885
[45] Date of Patent: Oct. 16, 1984

[54] CURRENT DUMP CIRCUIT FOR BIPOLAR RANDOM ACCESS MEMORIES

[75] Inventor: Kenneth P. Sharp, Palo Alto, Calif.

[73] Assignee: Fairchild Camera & Instrument Corporation, Mountain, Calif.

[21] Appl. No.: 340,145

[22] Filed: Jan. 18, 1982

[51] Int. Cl.³ .......................... G11C 7/02; G11C 8/00
[52] U.S. Cl. .................................... 365/204; 365/242; 365/190
[58] Field of Search ................ 365/190, 204, 203, 242

[56] References Cited

U.S. PATENT DOCUMENTS

| | | | |
|---|---|---|---|
| 3,765,002 | 10/1973 | Basse ................................... | 365/204 |
| 4,168,490 | 9/1979 | Stinehelfer .......................... | 265/204 |
| 4,357,687 | 11/1982 | Rufford ............................... | 365/204 |

Primary Examiner—Stuart N. Hecker
Assistant Examiner—Glenn Gossage
Attorney, Agent, or Firm—Kenneth Olsen; Carl L. Silverman; William H. Murray

[57] ABSTRACT

Circuitry for rapidly discharging a row of RAM cells upon deselection of the word line. The word line switching transistor collector current is sensed and corresponding voltage level signals are applied to a second switching transistor between the bottom word line of the memory row and a large dump current source. The emitter of the second switching transistor is clamped at a level that will permit the switching transistor to turn on only when there is no emitter current through the word line switching transistor to thereby rapidly discharge the capacitive row of memory cells and therefore improve the operating speed of the memory.

8 Claims, 1 Drawing Figure

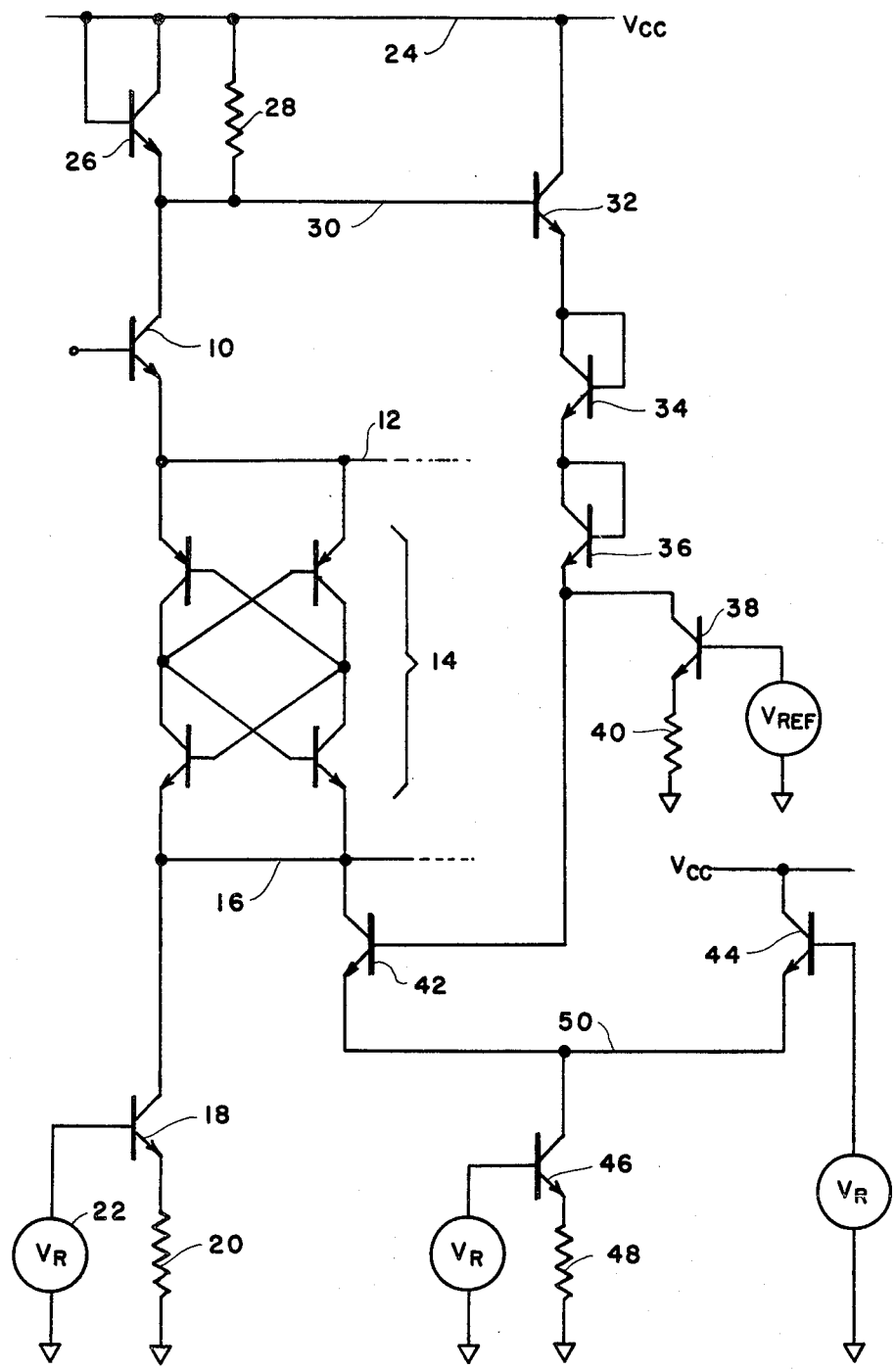

CURRENT DUMP CIRCUIT FOR BIPOLAR RANDOM ACCESS MEMORIES

TECHNICAL FIELD

This invention relates to digital computer random access memory circuitry and particularly to circuitry that senses the deselection of a memory word line and, in response thereto, provides a current dump for rapidly discharging the memory cells.

BACKGROUND ART

Bipolar random access memories (RAMs) are formed in a matrix of a plurality of rows and columns each containing a plurality of memory cells. Each cell in each column is coupled to a pair of bit lines and each cell in each row is connected to a pair of word lines. Selection of a particular cell in the matrix is accomplished by applying a voltage or current to the particular row and column that is common to the desired cell.

The plurality of memory cells in each row are enabled, or placed in a selected state, by the application of a voltage to the top word line in that row so that current may flow through the cell from the lower word line. The lower word line is generally connected through a suitable current source to a voltage reference, such as circuit ground, which operates to control or limit the current through the row of cells. Unfortunately, a row containing a plurality of cells is highly capacitive so that when a row is deselected by removal of the top word line voltage, the top word line will remain at its high voltage selected state until the row capacitance has been discharged. The time required for such capacitive discharge will obviously slow the operation of the memory.

The circuitry to be described and claimed herein senses the deselection of a word line to turn on a transistor switch to a large current dump source which very rapidly discharges all cell capacitance. The circuitry prevents large D.C. currents from flowing through any of the RAM rows and the high dump current cannot flow through the cells when the top word line is switched from its low deselected level to the selected or high state.

DISCLOSURE OF THE INVENTION

Briefly described, the circuitry senses the current flow through the word line switching transistor of a RAM memory and produces a voltage signal which is processed to control a high current dump transistor in parallel with the normal low current standby current source coupled to the lower word line in the memory row to thereby discharge the heavy row capacitances and thereby lowering the voltage on the top word line. When the voltage on the top word line drops to a level of one $V_{BE}$ below that of the deselected word line driver, the word line switching transistor will turn on, the processing circuitry will turn off the high current dump transistor, and the discharged row of memory cells stands ready for re-selection.

BRIEF DESCRIPTION OF THE DRAWINGS

The single FIGURE is an electrical schematic diagram of the current dump circuit of the invention.

BEST MODE FOR CARRYING OUT THE INVENTION

Referring now to the schematic diagram, the output of a conventional word line driver circuit (not shown) is coupled to the base of a word line switching transistor 10, the emitter of which is connected to the top word line 12 of a row of random access memory cells, such as the cell 14. Each of the cells, such as cell 14, is connected between the top word line 12 and a bottom word line 16 which is coupled to a voltage reference, such as circuit ground, through a low current standby current source. In the illustrated embodiment, the low current standby current source is comprised of an NPN transistor 18, the emitter of which is coupled through a suitable resistance 20 to circuit ground and the base of which is coupled to a voltage reference 22 at a level of 1.5 $V_{BE}$ above ground reference. The current source comprising the transistor 18 and series resistor 20 supplies a small amount of standby current into the RAM row to insure that no loss of data occurs during a deselected state.

The collector, of the word line switching transistor 10 is coupled to a $V_{CC}$ conductor 24 through a current sensing circuit comprising a diode-connected transistor 26 in parallel with a resistance 28. The emitter of the diode-connected transistor 26 is connected to the collector of the switching transistor 10 and to a conductor 30 that is coupled to the base of transistor 32. The collector of transistor 32 is coupled to the $V_{CC}$ conductor 24, and the emitter is coupled in series with two diode-connected transistors 34 and 36 to the current source comprising the transistor 38, the emitter of which is coupled through a resistance 40 to circuit ground. The base of transistor 38 is coupled to a voltage reference equal to 1.5 $V_{BE}$.

The collector of the current source 38 and the emitter of the diode coupled transistor 36 are connected to the base of a switching transistor 42, the collector of which is connected to the lower word line 16 in a row of memory cells which includes the cell 14. The emitter of transistor 42 is connected to the emitter of a transistor 44, the collector of which is connected to a $V_{CC}$ conductor and the base of which is connected to a voltage reference that is maintained by a voltage reference at a level of 3.5 $V_{BE}$ below the level of $V_{CC}$. The emitters of transistors 42 and 44 are coupled to the collector of a transistor 46, the emitter of which is coupled to circuit ground through a resistance 48. The current source comprising transistor 46 and resistance 48 in series provides a large current dump which provides a current path between the lower word line 16 and circuit ground.

OPERATION OF THE CIRCUITRY

Assume an initial state in which the word line driver is supplying a high select signal to the base of the switching of transistor 10 to thereby select the cell row containing cell 14 for reading or writing. Transistor 10 is therefore on and is drawing current provided by the current source comprising the transistor 18 in series with resistance 20. Because transistor 10 is on, the top word line 12 is at a level of one $V_{BE}$ below the level of the word line voltage applied to the base of transistor 10. Collector current through transistor 10 flows through the diode-connected transistor 26 and resistance 28 so that the voltage on the conductor 30 is equal to the level of $V_{CC}$ less the $V_{BE}$ of the transistor 26.

The emitter follower transistor 32 and the diode-connected transistors 34 and 36 are on because of the small amount of current provided by the current source comprising the transistor 38 and resistance 40. Thus, the voltage level on the conductor 30 is translated down so that the voltage applied to the base of the transistor 42 is 3 $V_{BE}$ below the voltage level on conductor 30, or 4 $V_{BE}$ below the level of $V_{CC}$. Since the base of a transistor 44 is maintained at a level of 3.5 $V_{BE}$ below the level of $V_{CC}$, transistor 44 is on so that the voltage level at the emitter of transistor 44 is clamped at 4.5 $V_{BE}$ below $V_{CC}$. This level is applied to conductor 50 and to the emitter of transistor 42. The voltage across the base-emitter junction of transistor 42 is insufficient to turn on transistor 42 which therefore remains non-conducting. The transistor 44 therefore carries all of the relatively large dump current provided by the current source comprising transistor 46 and resistance 48. With switching transistor 42 maintained non-conductive, flow of word line current to the row of cells is provided by the low standby current source comprising transistor 18 and resistor 20.

Assume now that the word line driver circuit switches to its low state for deselecting the cell row comprising the cell 14. The base of switching transistor 10 is now switched to its low level. However, the voltage on the top word line does not fall because of the heavy cell capacitance which has only a low-cell standby current provided to discharge that capacitance. Therefore, the base-emitter junction of transistor 10 is reverse biased so that transistor 10 turns off. With substantially no emitter current passing through the resistance 28, the voltage level on the conductor 30 rises toward the level of $V_{CC}$ at a rate determined by its effective RC time constant. The emitter voltage on the emitter follower transistor 32 also increases to maintain a level of 1 $V_{BE}$ below the voltage level on conductor 30 and, similarly, the voltage level at the emitter of the diode-connected transistor 36 raises to maintain a level of 3 $V_{BE}$ below the level on conductor 30. As the voltage applied to the base of the switching transistor 42 rises with the rising voltage on the conductor 30, the transistor 42 will turn on and the transistor 44 will begin to turn off. When the voltage on the base of transistor 42 is equal to 3.5 $V_{BE}$ below the $V_{CC}$ level, both transistors 42 and 44 will have an equal current. As the voltage on the base of transistor 42 becomes greater than 3.5 $V_{BE}$ below the $V_{CC}$ level, transistor 42 takes more current and transistor 44 takes less. This large dump current becomes the collector current of the transistor 42 and is in parallel with the standby current provided by the low current source comprising transistor 18 and resistor 20. The large dump current will very rapidly discharge the large cell capacitance and will permit the voltage level on the top word line 12 to rapidly drop.

When the voltage level on the top word line 12 falls to a level of 1 $V_{BE}$ below the deselected word line driver signal applied to the base of transistor 10, that transistor will again turn on. The collector current of transistor 10 will therefore increase through the resistance 28 to lower the voltage level on the conductor 30. Since the voltage applied to the base of the switching transistor 42 is at a constant level below the voltage on the conductor 30, the lowering of the base voltage to transistor 42 will cause transistor 42 to conduct less and will begin to turn on the transistor 44 which carries more and more of the dump current as transistor 42 carries less. Finally, the voltage on the conductor 30 is clamped at a level of 1 $V_{BE}$ below the level of $V_{CC}$ and the voltage to the base of transistor 42 is clamped at 4 $V_{BE}$ below $V_{CC}$. Transistor 42 is now completely off and transistor 44 carries all of the dump current. The row of memory cells is now completely discharged and stands ready for re-selection.

The circuitry thus operates to sense changes in the word line switching transistor collector current, develop a corresponding voltage signal which is processed in a circuit including the signal translating emitter follower 32 and diodes 34 and 36 to control the conduction of a dump switch 42 which is balanced against a current shunting transistor 44 to rapidly conduct upon deselection of the word line and which is turned off when the heavy cell capacitances have been discharged and the voltage on the top word line drops below the deselected level of the word line driver circuit.

I claim:

1. A RAM current dump circuit for rapidly discharging a row of memory cells connected between top and bottom word lines upon deselection of the row by a word line driver, said dump circuit comprising:
    (a) word line switch means, responsive to signals from said word line driver, coupled to said top word line for selectively applying a voltage thereto;
    (b) current sensing means, coupled between said word line switch means and a $V_{CC}$ source, for sensing changes in current through said word line switch means and producing a first voltage level when current is flowing through said switch means and a second voltage level when substantially no current is flowing through said switch means; and
    (c) current steering means, operatively associated with said current sensing means, for steering a dump current to said bottom word line in response to said second voltage level and away from said bottom word line in response to said first voltage level.

2. The RAM current dump circuit claimed in claim 1 wherein said word line switch means comprises a transistor switch.

3. The RAM current dump circuit claimed in claim 1 wherein said current steering means comprises:
    (a) a current dump switching transistor having a collector coupled to said bottom word line and an emitter coupled to a dump current source, said current dump switching transistor responsive to the voltage levels produced by said current sensing means; and
    (b) a shunting transistor coupled between said $V_{CC}$ source and the emitter of said current dump switching transistor, said shunting transistor having a base coupled to a voltage source that clamps said emitter at a voltage level that prevents conduction of said current dump switching transistor during the production of the first voltage level by said current sensing means and permits conduction of said current dump switching transistor during production of the second voltage level.

4. The RAM current dump circuit claimed in claim 3, wherein said current sensing means includes a diode and wherein said first voltage level signal is clamped at one base-emitter voltage drop below said $V_{CC}$ source level and wherein said second voltage level signal approaches said $V_{CC}$ source level.

5. The RAM current dump circuit claimed in claim 4 further including signal translating circuitry for dropping said first and second voltage level signals by equal amounts to the base of said current dump switching transistor.

6. The RAM current dump circuit claimed in claim 5 wherein said shunting transistor clamps the emitter of said current dump transistor switch at a level of 4.5 base-emitter voltage drops below the level of said $V_{CC}$ source, said first level signal translated to the base of said dump switching transistor is 4.0 base-emitter voltage drops below said $V_{CC}$ level, and said second voltage level translated to said dump switching transistor is at a level approaching 3 base-emitter drops below said $V_{CC}$ level.

7. The RAM current dump circuit claimed in claim 5 wherein said signal translating circuitry includes an emitter follower transistor coupled between said $V_{CC}$ source and a first current source, said current emitter-follower transistor being responsive to said voltage signal produced by said current sensing means, and further includes at least one diode transistor coupled in series between the emitter of said emitter-follower transistor and said current source.

8. The RAM current dump circuit claimed in claim 7 further including a second current source coupled between the bottom word line of said memory row and a reference voltage level, said second current source providing low standby current for maintaining the memory of cells in said row, said current dump switching transistor and said dump current source being coupled in parallel with said second current source.

* * * * *